(12) United States Patent
Model

(10) Patent No.: US 9,823,320 B2
(45) Date of Patent: Nov. 21, 2017

(54) CURRENT SUPPLY OF A MAGNETIC RESONANCE IMAGING INSTALLATION

(71) Applicant: Volker Model, Fürth (DE)

(72) Inventor: Volker Model, Fürth (DE)

(73) Assignee: Siemens Healthcare, Erlangen (DE)

( * ) Notice: Subject to any disclaimer, the term of this patent is extended or adjusted under 35 U.S.C. 154(b) by 0 days.

(21) Appl. No.: 15/451,963

(22) Filed: Mar. 7, 2017

(65) Prior Publication Data

US 2017/0261575 A1    Sep. 14, 2017

(30) Foreign Application Priority Data

Mar. 9, 2016   (DE) ......................... 10 2016 203 817

(51) Int. Cl.
*G01R 33/3815*   (2006.01)
*H02M 7/06*   (2006.01)
*G01R 33/422*   (2006.01)

(52) U.S. Cl.
CPC ....... *G01R 33/3815* (2013.01); *G01R 33/422* (2013.01); *H02M 7/06* (2013.01)

(58) Field of Classification Search
CPC .............. G01R 33/3815; G01R 33/422; G01R 33/3802; G01R 33/38; G01R 33/36; G01R 33/381; G01R 33/385; G01R 33/3858; H02M 7/06
USPC .................................. 324/318–322
See application file for complete search history.

(56) References Cited

U.S. PATENT DOCUMENTS 6,410,996 B1   6/2002   Kuth
9,075,102 B2   7/2015   Ham

2009/0309598 A1*   12/2009   Zhu .................. H02M 7/217
  324/322
2011/0210739 A1   9/2011   Ham
2012/0182012 A1*   7/2012   Lvovsky ............ G01R 33/3815
  324/318

(Continued)

FOREIGN PATENT DOCUMENTS

DE        19516641 A1    11/1996
DE    102008038989 A1    10/2009

(Continued)

OTHER PUBLICATIONS

English translation of Herbert (DE 102008038989), pp. 1-12, provided by Espacenet on Sep. 8, 2017.*

(Continued)

*Primary Examiner* — Melissa Koval
*Assistant Examiner* — Rishi Patel
(74) *Attorney, Agent, or Firm* — Lempia Summerfield Katz LLC

(57) ABSTRACT

A circuit arrangement is provided for the current supply of a magnetic resonance imaging installation with a radio-frequency shielding cabin and at least one basic field magnet. The arrangement includes a first circuit arranged outside the radio-frequency shielding cabin and configured to generate a DC link voltage from a grid voltage, and a second circuit arranged within the radio-frequency shielding cabin and configured to generate a magnetization current for the basic field magnet from the DC link voltage. This architecture makes it possible to realize a cost-effective solution for an integrated (fixedly installed) modular magnetization current supply.

15 Claims, 2 Drawing Sheets

(56) References Cited

U.S. PATENT DOCUMENTS

2013/0147485 A1* 6/2013 Yokoi .................. G01R 33/385
                                                324/318
2014/0077812 A1* 3/2014 Sabate ............... G01R 33/3852
                                                324/319

FOREIGN PATENT DOCUMENTS

EP          2184615  A1    5/2010
JP        2002224079  A    8/2002

OTHER PUBLICATIONS

"Magnetic Resonance Imaging." https://en.wikipedia.org/wiki/Magnetic_resonance_imaging. Received Mar. 7, 2017.
German Office Action for German Application No. 10 2016 203 817.6, dated Oct. 27, 2016, with English Translation.
European Search Report for European Application No. 17153085.0-1568, dated Aug. 2, 2017.

* cited by examiner

CURRENT SUPPLY OF A MAGNETIC RESONANCE IMAGING INSTALLATION

RELATED CASE

This application claims the benefit of DE 102016203817.6, filed on Mar. 9, 2016, which is hereby incorporated by reference in its entirety.

FIELD

The present embodiments to a circuit arrangement for the current supply of a magnetic resonance imaging installation including a radio-frequency shielding cabin and at least one basic field magnet. The invention also relates to a magnetic resonance imaging installation including a circuit arrangement for current supply, and to a method for operating a magnetic resonance imaging installation.

BACKGROUND

Magnetic resonance imaging (magnetic resonance tomography MRT, also MR for short; also called nuclear spin tomography; abbreviated to MRI) is an imaging method used primarily in medical diagnosis for the representation of structure and function of tissue and organs in the human body. It is based on the physical principles of nuclear spin resonance and is therefore sometimes also referred to as nuclear spin tomography.

Magnetic resonance imaging can be used to generate slice images of the human (or animal) body that allow an assessment of the organs and of many pathological organ changes. Magnetic resonance tomography is based on strong magnetic fields and alternating electromagnetic fields in the radio-frequency range that resonantly excite atomic nuclei (usually hydrogen protons). Electrical signals are induced in a receiver circuit. Neither X-ray radiation nor any other ionizing radiation is generated or used in magnetic resonance imaging. The different relaxation times of different types of tissue form an essential basis for the image contrast. In addition, the different content of hydrogen atoms in different tissues (e.g. muscle, bones) also contributes to the image contrast.

In order to obtain an image on the basis of magnetic resonance imaging, that is to say to generate a magnetic resonance recording of an examination object, firstly the body or the body part to be examined of the patient is exposed to a static basic magnetic field, which is as homogeneous as possible and which is generated by a basic field magnet of the magnet system of the magnetic resonance imaging installation. During the recording of the magnetic resonance images, rapidly switched gradient fields for spatial coding are superimposed on this basic magnetic field. The gradient fields are generated by the gradient coils of the magnet system. Moreover, a radio-frequency antenna of the magnetic resonance imaging installation radiates radio-frequency pulses having a defined field strength into the examination volume. For this purpose, the magnetic resonance imaging installation generally includes a fixedly incorporated radio-frequency antenna, the so-called whole body coil. The atoms in the examination object are excited by the radio-frequency pulses in such a way that the atoms are deflected by a so-called "excitation flip angle" from their equilibrium position running parallel to the basic magnetic field. The magnetic resonance signals generated during "deflection back" are detected by at least one non-stationary local coil and fed for further processing. In this case, the local coil is arranged as near to the patient as possible, e.g. placed on the patient.

The basic field magnets are generally superconducting magnets that require a regulatable current supply that makes available the energy for establishing the magnetic field. Electronic and electrical components installed on the basic field magnet of the magnetic resonance imaging installation likewise require a current supply. The use of switching converters for an energy-efficient current supply with little power loss proves to be difficult since multiples of the switching frequencies and the mixed products thereof may cause disturbances in the MR signal.

It is known from the art to carry the current supplies for the superconducting magnets for a service deployment (ramp-up, ramp-down) as a service tool. This causes a logistical complexity and requires thorough preplanning. An immediate or even spontaneous deployment is not possible.

A further possibility for current supply is a fixed installation, which, in a manner similar to the mobile variant, has to be set up outside the region of influence of the magnetic field and also outside the electromagnetic shielding required for magnetic resonance imaging installations (the so-called radio-frequency shielding cabin or RF cabin).

In both embodiments described, the entire magnetization current (sometimes also referred to as "magnet current"), which as a general rule is a few hundred amperes, has to flow via long cables and in some instances through bushing filters.

Current supplies for the electronic and electrical components operated within the electromagnetic shielding are generally installed outside the shielding cabin. Voltage is fed in via a multiplicity of lines respectively requiring bushing filters. Linear regulators or switching converters with corresponding filtering are usually used in the components themselves. The use of ferrite-containing inductive components or (ferro)magnetic components poses a particular challenge since saturation effects, a deformation of the basic magnetic field and considerable force actions may occur.

SUMMARY AND DETAILED DESCRIPTION

It is an object to specify a circuit arrangement for the current supply of a magnetic resonance imaging installation, a magnetic resonance imaging installation and a method for operating a magnetic resonance imaging installation which enable simple feeding of the superconducting basic field magnets.

According to one embodiment, a circuit arrangement of substantially two function blocks is specified, wherein the first function block is arranged outside the RF cabin and generates a DC link voltage. The DC link voltage is fed via a cable to the second function block—situated in the RF cabin—with DC-DC converters that supply the magnetization current for the basic field magnet.

A DC-DC converter denotes an electrical circuit that converts a DC voltage fed in at the input into a DC voltage having a higher, lower or inverted voltage level. The conversion takes place with the aid of a periodically operating electronic switch and one or more energy stores. DC-DC converters are classed among the self-commutated power converters. In the field of electrical power engineering, DC-DC converters are also referred to as DC choppers.

The architecture according to the embodiment is based on a functional and local separation of the individual constituents of the current supply. Optionally, an alternative use of individual function blocks may be provided. The individual function blocks are designed in accordance with the operating state with maximum power demand. It is assumed that not all of the assemblies have to be active in every operating state.

The maximum power for the magnetization current supply is required during the charging of the basic field magnet (ramp-up). Other electrical and electronic components are not required during ramp-up. The magnetization current supply is therefore a fixedly installed constituent of the magnetic resonance imaging installation. While the magnetic resonance imaging installation is in operation, the magnetization current supply is not required. Other electrical and electronic components can optionally use parts of the current supply (e.g. transformer, rectifier circuit, cabling, control and monitoring).

Another embodiment includes a circuit arrangement for the current supply of a magnetic resonance imaging installation. The circuit arrangement includes a radio-frequency shielding cabin and at least one basic field magnet. The arrangement includes: a first circuit, which is arranged outside the radio-frequency shielding cabin and which generates a DC link voltage from a grid voltage, and a second circuit, which is arranged within the radio-frequency shielding cabin and which generates a magnetization current for the basic field magnet from the DC link voltage.

This architecture makes it possible to realize a cost-effective solution for an integrated (fixedly installed) modular magnetization current supply. The power transfer to the basic field magnet by a link circuit reduces the power losses. Cables, connectors and filters have to be designed for lower currents. The optional, alternative use of individual electrical and electronic components in the different operating states reduces circuit and cost expenditures. The modular construction enables a flexible adaptation of the system current supply to different embodiments of a magnetic resonance imaging installation.

In one development of the circuit arrangement, the grid voltage is a three-phase AC voltage.

In a further embodiment, the first circuit includes a transformer and a three-phase inverter connected in series.

In one development, the three-phase inverter is designed as a six-pulse rectifier or as a twelve-pulse rectifier.

In a further embodiment, the second circuit includes a current sink, which discharges the basic field magnet in a regulated manner.

In a further configuration, the second circuit includes an input filter, a plurality of parallel-connected first DC-DC converters, and a current/voltage measuring device or sensor connected in series.

In one development, the first DC-DC converter is designed as regulatable current sources with voltage limiting.

In a further configuration, the second circuit includes a controller (e.g., a control and evaluation unit), which controls the current sink, the first DC-DC converters, and the current/voltage measuring device or sensor.

In a further configuration, the arrangement includes a cable with at least one feed line and at least one return line. The cable connects the first and second circuit devices.

In one development, the second circuit device includes a second DC-DC converter, which is fed by the DC link voltage and which supplies electrical and electronic units or components in the radio-frequency shielding cabin with current.

The circuit arrangement may be used in a magnetic resonance imaging installation.

Moreover, other embodiments are for a method for operating a magnetic resonance imaging installation. For charging the basic field magnet, the first DC-DC converters are switched on and the second DC-DC converter is switched off.

In one development of the method, after the charging of the basic field magnet, the first DC-DC converters are switched off and the second DC-DC converter is switched on.

BRIEF DESCRIPTION OF THE DRAWINGS

Further special features and advantages will become apparent from the following explanations of a plurality of exemplary embodiments with reference to schematic drawings.

In the figures.

DETAILED DESCRIPTION OF EXEMPLARY EMBODIMENTS

Figure 1:
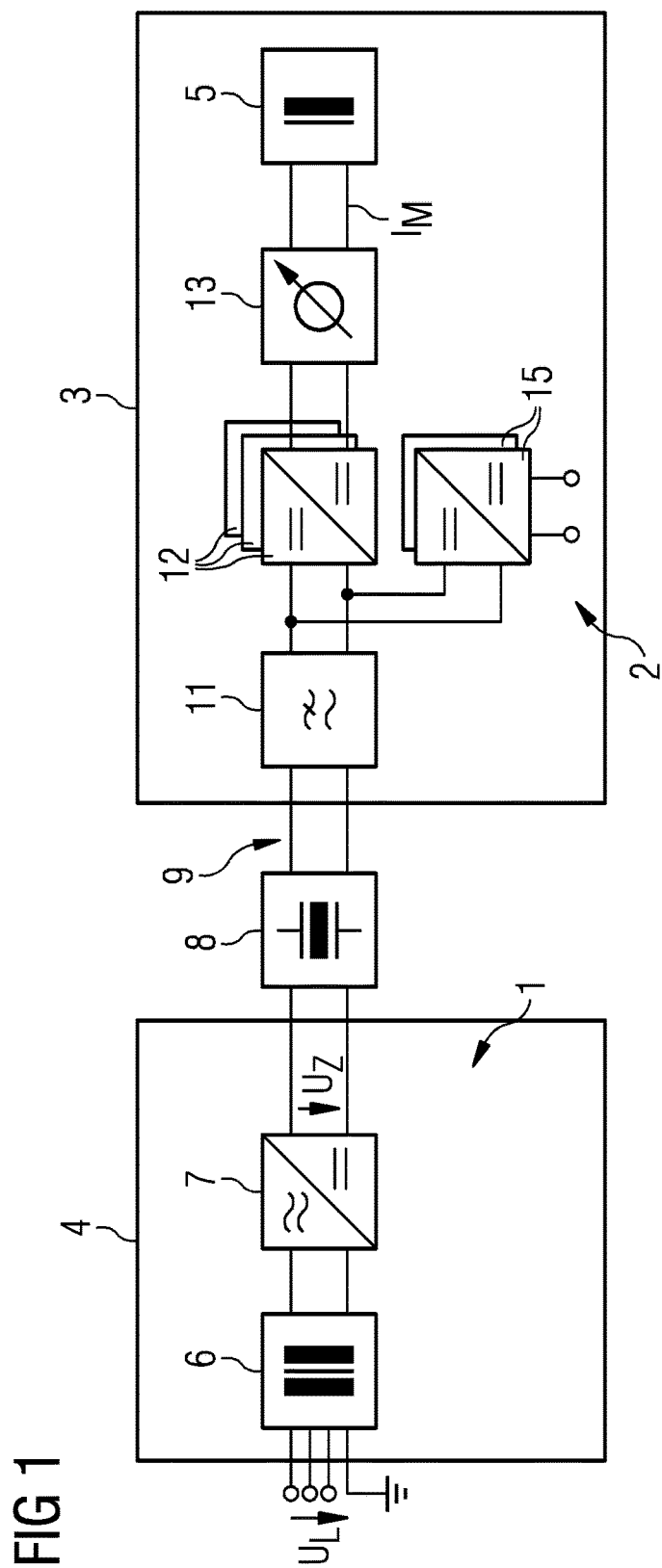
FIG. 1 shows one embodiment of a block diagram of a current supply.

FIG. 1 shows a block diagram of a current supply for feeding a basic field magnet 5 divided into a first circuit or first circuit device 1 for generating a DC link voltage $U_Z$ and into a second circuit or second circuit device 2 for actually generating the magnetization current $I_M$.

A three-phase AC grid voltage $U_L$ is fed to a transformer 6. The stepped-down AC current is applied to a three-phase inverter 7, which generates the DC link voltage $U_Z$. Inter alia, the residual ripple is also reduced by a bushing filter 8. The DC link voltage $U_Z$ has a value of a maximum of 60 V. The transformer 6 and the three-phase inverter 7 are situated in a non-shielded technical room 4.

In the simplest case, the three-phase inverter (rectifier circuit) is a single rectifier, a switched rectifier or an active rectifier with PFC. The DC link voltage $U_Z$ is lower than the peak value of the grid voltage $U_L$, but higher by a multiple than the output voltage with the highest power demand. The voltage ratio may be set either by the transformer 6 or by an active rectifier. The transformer 6 or the rectifier is designed such that the transformer 6 or the rectifier satisfies the normative requirements made of power supply units with regard to surge, isolation, leakage, etc.

Via an electrical cable 9, the DC link voltage $U_Z$ is fed to an input filter 11 (a capacitor in the simplest case) of the second circuit device 2. Thus only a single cable 9 having outgoing and return lines is required for the current supply of the basic field magnet 5. The cable 9 and the input filter 11 are designed in accordance with the maximum power demand. In this case, in comparison with an external magnetization current supply, the current loading capacity may be reduced significantly, virtually as the ratio of the DC link voltage $U_Z$ to the output voltage of the magnetization current supply. The DC link circuit likewise reduces disturbances and the (changing) force effects on components and cables that are caused by the Lorentz force, particularly in comparison with an AC supply.

The DC link voltage $U_Z$ filtered in this way is then brought to a low voltage level in a plurality of parallel-connected first DC-DC converters 12, in order to provide the required magnetization current $I_M$ of a magnitude of approximately 400 A (up to max. 600 A) for charging (ramp-up) of the basic field magnet 5. The magnetization current $I_M$ and the output voltage are monitored with the aid of the current/voltage measuring device or sensor 13. Other electrical and electronic components may be supplied with the aid of second DC-DC converters 15.

The input filter 11, the first DC-DC converters 12, the second DC-DC converter 15 and the current/voltage measuring device 13 are situated in the radio-frequency shielding cabin 3 and are part of the second circuit device 2.

The first DC-DC converters 12 may be operated with high clock frequency on account of the relatively low DC link voltage $U_Z$. In this case, ferrite-free inductive components may be used, the function of which is not influenced by the basic magnetic field. The second DC-DC converter 15, which is active during the operation of the magnetic resonance imaging installation, may also be operated with frequencies that match the frequency plan of the magnetic resonance imaging installation and thus cannot cause any disturbances.

The magnetization current supply is implemented by a plurality of parallel-connected current sources with voltage limiting. The current sources may be operated with an optimum mark-space ratio, or with one or a plurality of parallel high-resolution current sources. The function of a DAC arises from the construction, the connection and disconnection of individual modules. This architecture may also be applied to other current supplies for high power demand.

Figure 2:
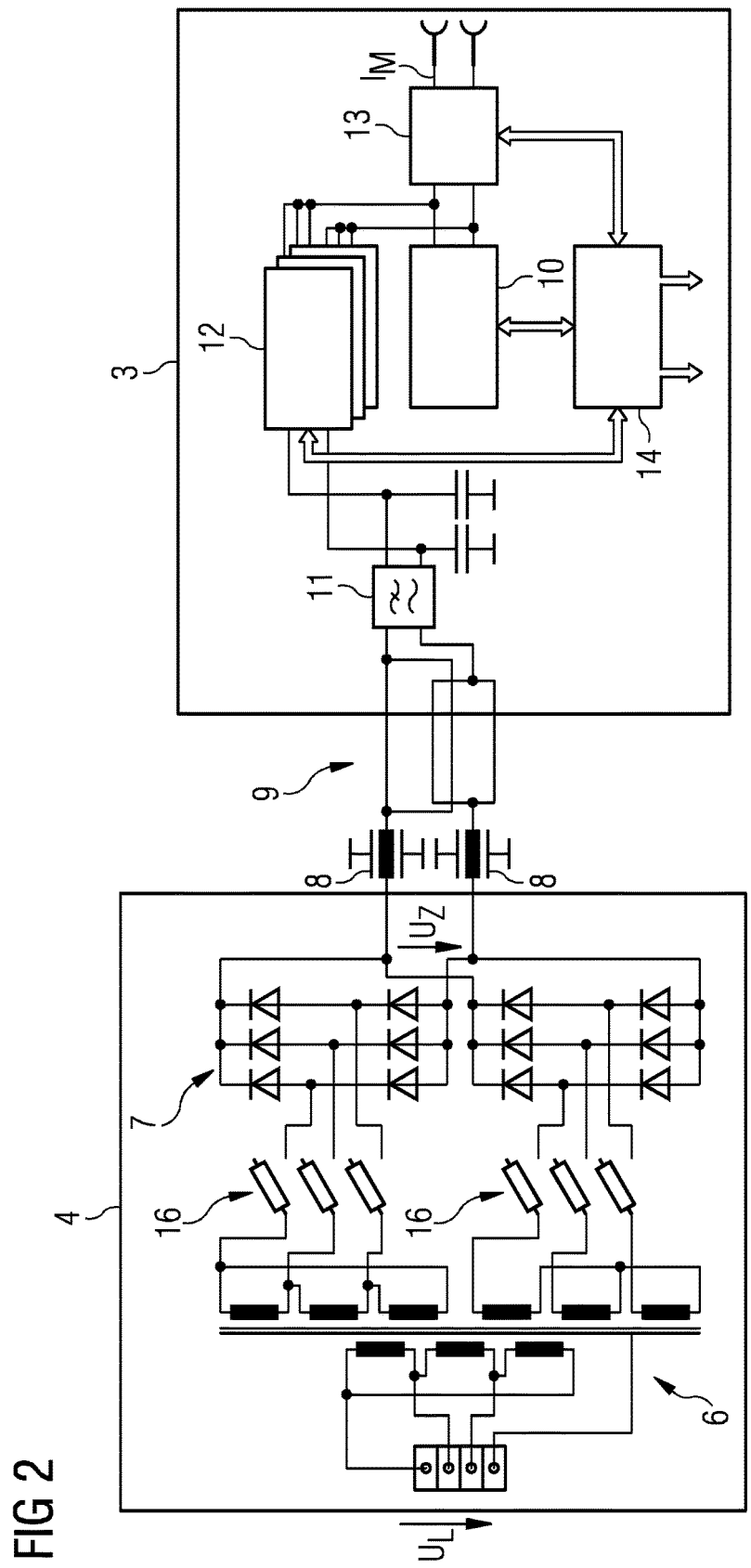
FIG. 2 shows a circuit diagram of a current supply, according to one embodiment.

FIG. 2 shows a circuit diagram of a current supply for a magnetic resonance imaging installation. In particular the current supply is for charging a superconducting basic field magnet. The current supply is subdivided into two function blocks or circuits: a first circuit 1 in the non-shielded technical room 4 for generating a DC link voltage $U_Z$, and a second circuit 2 in the radio-frequency shielding cabin 3 for generating the magnetization current $I_M$. The first circuit 1 is electrically connected to the second circuit 2 via the cable 9. Four twisted cores that are short-circuited in pairs are used for suppressing interference.

The three-phase AC grid voltage $U_L$ is fed to a transformer having an iron core and, on the secondary side, via thermomagnetic switches 16 (as fuse), to a three-phase inverter 7. The three-phase inverter 7 is a twelve-pulse rectifier or a six-pulse rectifier depending on the switching position of the switches 16. The DC link voltage $U_Z$ occurring at the output is also freed of its residual ripple, inter alia, in the case of current flow, by the two bushing filters 8. The bushing filters 8, the shielding effect of which corresponds to that of the radio-frequency shielding cabin 3, substantially serve for suppressing the line-conducted electromagnetic interference into and out of the radio-frequency shielding cabin 3.

Via the cable 9, the DC link voltage $U_Z$ passes via the input filter 11 to the parallel-connected first DC-DC converters 12, which supply the magnetization current $I_M$ via the current/voltage measuring device.

A current sink 10 connected to the outputs of the first DC-DC converters 12 is used for discharging (ramp-down) of the basic field magnet. A control and evaluation unit 14 controls the first DC-DC converters 12 and the current sink 10 and evaluates the measurement data of the current/voltage measuring device or sensor 13. Alternatively, the discharging may also be effected by grid feedback by first DC-DC converters 12 and three-phase inverter 7.

Although the invention has been more specifically illustrated and described in detail by the exemplary embodiments, the invention is not restricted by the examples disclosed and other variations can be derived therefrom by the person skilled in the art, without departing from the scope of protection of the invention.

It is intended that the foregoing description be regarded as illustrative rather than limiting, and that it be understood that all equivalents and/or combinations of embodiments are intended to be included in this description.

It is to be understood that the elements and features recited in the appended claims may be combined in different ways to produce new claims that likewise fall within the scope of the present invention. Thus, whereas the dependent claims appended below depend from only a single independent or dependent claim, it is to be understood that these dependent claims can, alternatively, be made to depend in the alternative from any preceding or following claim, whether independent or dependent, and that such new combinations are to be understood as forming a part of the present specification.

The invention claimed is:

1. A circuit arrangement for the current supply of a magnetic resonance imaging installation comprising a radio-frequency shielding cabin and at least one basic field magnet, the circuit arrangement comprising:
    a first circuit arranged outside the radio-frequency shielding cabin and configured to generate a DC link voltage from a grid voltage, and
    a second circuit arranged within the radio-frequency shielding cabin and configured to generate a magnetization current for the basic field magnet from the DC link voltage, wherein the second circuit comprises an input filter, a plurality of parallel-connected first DC-DC converters, and a current or voltage sensor, the input filter, first DC-DC converters and current or voltage sensor connected in series.

2. The circuit arrangement as claimed in claim 1, wherein the grid voltage is an AC voltage.

3. The circuit arrangement as claimed in claim 1, wherein the first circuit comprises:
    a transformer; and
    a three-phase inverter connected in series with the transformer.

4. The circuit arrangement as claimed in claim 3, wherein the three-phase inverter is a twelve-pulse rectifier or six-pulse rectifier.

5. The circuit arrangement as claimed in claim 1 wherein the second circuit further comprises a current sink configured to discharge the basic field magnet.

6. The circuit arrangement as claimed in claim 1, wherein the first DC-DC converters are regulatable current sources with an adjustable voltage limiting.

7. The circuit arrangement as claimed in claim 5, further comprising a controller of the second circuit, the controller configured to control the current sink, the first DC-DC converters and the current or voltage sensor.

8. The circuit arrangement as claimed in claim 1 further comprising a cable having at least one feed line and at least one return line, said cable connecting the first and second circuits.

9. The circuit arrangement as claimed in claim 1, wherein the second circuit further comprises a second DC-DC converter fed by the DC link voltage and configured to supply electrical components in the radio-frequency shielding cabin with current.

10. The circuit arrangement as claimed in claim 3 wherein the second circuit further comprises a current sink configured to discharge the basic field magnet.

11. The circuit arrangement as claimed in claim 7 further comprising a cable having at least one feed line and at least one return line, said cable connecting the first and second circuits.

12. The circuit arrangement as claimed in claim 6, further comprising a controller of the second circuit, the controller configured to control a current sink, the first DC-DC converters and the current or voltage sensor.

13. A magnetic resonance imaging installation comprising:
   a circuit arrangement for current supply having:
   a first circuit arranged outside a radio-frequency shielding cabin and configured to generate a DC link voltage from a grid voltage, and
   a second circuit arranged within the radio-frequency shielding cabin and configured to generate a magnetization current for the basic field magnet from the DC link voltage, wherein the second circuit comprises an input filter, a plurality of parallel-connected first DC-DC converters, and a current or voltage sensor, the input filter, first DC-DC converters and current or voltage sensor connected in series.

14. A method for operating a magnetic resonance imaging installation, the method comprising:
   generating a DC link voltage from a grid voltage with a first circuit arranged outside a radio-frequency shielding cabin;
   generating a magnetization current for a basic field magnet from the DC link voltage with a second circuit arranged within the radio-frequency shielding cabin, the second circuit comprising an input filter, a plurality of parallel-connected first DC-DC converters, a current or voltage sensor connected in series with the input filter and the first DC-DC converters, and a second DC-DC converter fed by the DC link voltage;
   supplying current from the second DC-DC converter to components within the radio-frequency shielding cabin; and
   charging the basic field magnet by switching on first DC-DC converters and switching off a second DC-DC converter.

15. The method of claim 14, further comprising, after the charging of the basic field magnet, switching the first DC-DC converters off and switching the second DC-DC converter on.

* * * * *